United States Patent
Shute

(10) Patent No.: US 12,218,634 B2
(45) Date of Patent: Feb. 4, 2025

(54) DYNAMIC ENVELOPE-TRACKING SUPPLY RAIL VOLTAGE SETTING

(71) Applicant: QUALCOMM Incorporated, San Diego, CA (US)

(72) Inventor: Nicholas Shute, Impington (GB)

(73) Assignee: QUALCOMM Incorporated, San Diego, CA (US)

( * ) Notice: Subject to any disclaimer, the term of this patent is extended or adjusted under 35 U.S.C. 154(b) by 713 days.

(21) Appl. No.: 17/447,599

(22) Filed: Sep. 14, 2021

(65) Prior Publication Data
US 2023/0085587 A1 Mar. 16, 2023

(51) Int. Cl.
*H03F 1/02* (2006.01)
*H03F 3/195* (2006.01)
*H03F 3/24* (2006.01)

(52) U.S. Cl.
CPC .......... *H03F 1/0227* (2013.01); *H03F 3/195* (2013.01); *H03F 3/245* (2013.01); *H03F 2200/102* (2013.01); *H03F 2200/435* (2013.01); *H03F 2200/451* (2013.01)

(58) Field of Classification Search
CPC ........ H03F 1/0227; H03F 3/195; H03F 3/245; H03F 2200/102; H03F 2200/435; H03F 2200/451; H03F 1/025; H03F 2200/387; H03F 3/213
USPC ......................................................... 330/127
See application file for complete search history.

(56) References Cited

U.S. PATENT DOCUMENTS

2008/0068240 A1 * 3/2008 Matsuura ................ H03M 3/51
341/143

OTHER PUBLICATIONS

International Search Report and Written Opinion—PCT/US2022/075769—ISA/EPO—Dec. 21, 2022.

* cited by examiner

*Primary Examiner* — Andrea Lindgren Baltzell
*Assistant Examiner* — Jose E Pinero
(74) *Attorney, Agent, or Firm* — Patterson+ Sheridan, L.L.P.

(57) ABSTRACT

The present disclosure generally relates to techniques and apparatus for implementing an envelope-tracking power supply for a radio frequency (RF) power amplifier. One aspect includes an amplification system. The amplification system may include a first amplifier configured to generate an amplifier output voltage, a second amplifier having an output coupled to a supply node for the first amplifier, a voltage regulator having an output coupled to a supply node for the second amplifier, and control circuitry configured to control the voltage regulator to generate a supply voltage at the supply node for the second amplifier based on an indication associated with the amplifier output voltage. In some aspects, the control circuitry may be configured to control the voltage regulator through at least providing an updated control setting for the voltage regulator with a periodicity associated with a power control period.

28 Claims, 8 Drawing Sheets

DYNAMIC ENVELOPE-TRACKING SUPPLY RAIL VOLTAGE SETTING

FIELD OF THE DISCLOSURE

The present disclosure generally relates to an electronic circuit, and more particularly, to techniques for implementing an envelope-tracking power supply.

DESCRIPTION OF RELATED ART

Electronic device technologies have seen explosive growth over the past several years. For example, growth of cellular and wireless communication technologies has been fueled by better communications, more capable hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Increasing efficiency of electronic devices is becoming more and more important as consumers demand longer battery life for devices. One technique for increasing battery life is to improve the efficiency of power supply circuitry for the electronic devices.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects provide an amplification system. The amplification system generally includes: a first amplifier configured to generate an amplifier output voltage; a second amplifier having an output coupled to a supply node for the first amplifier; a voltage regulator having an output coupled to a supply node for the second amplifier; and control circuitry configured to control the voltage regulator to generate a supply voltage at the supply node for the second amplifier based on an indication associated with the amplifier output voltage, the control circuitry being configured to control the voltage regulator through at least providing an updated control setting for the voltage regulator with a periodicity associated with a power control period.

Certain aspects provide a method for signal amplification. The method generally includes: controlling a voltage regulator to generate a first supply voltage at a supply node for a first amplifier based on an indication associated with an amplifier output voltage, wherein controlling the voltage regulator includes providing an updated control setting for the voltage regulator with a periodicity associated with a power control period; generating, via the first amplifier, a second supply voltage at a supply node for a second amplifier; and generating, via the second amplifier, the amplifier output voltage.

Certain aspects provide an apparatus for signal amplification. The apparatus generally includes: means for controlling a voltage regulator to generate a first supply voltage based on an indication associated with an amplifier output voltage, the means for controlling comprising means for providing an updated control setting for the voltage regulator with a periodicity associated with a power control period; means for generating a second supply voltage using the first supply voltage; and means for generating the amplifier output voltage using the second supply voltage.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
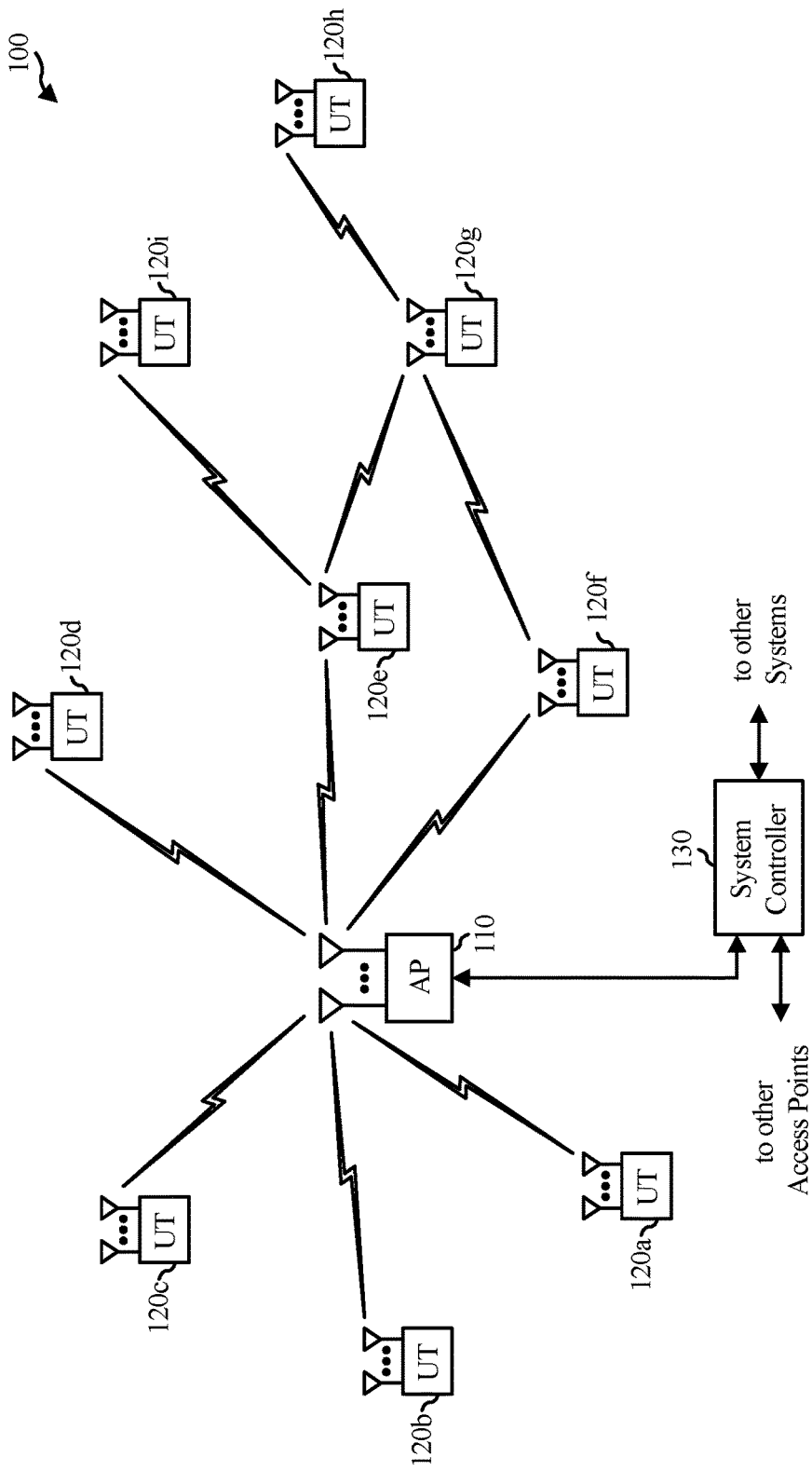
FIG. 1 illustrates a wireless communications system with access points and user terminals, in which aspects of the present disclosure may be practiced.

Certain aspects of the present disclosure are directed to apparatus and techniques for signal amplification using an amplification system. The amplification system may be implemented with envelope tracking using an error amplifier that generates a supply voltage for a power amplifier in accordance with an envelope of an input signal to the power amplifier. In some aspects, the supply voltage to the error amplifier may be dynamically controlled. For example, the supply voltage to the error amplifier may be controlled (e.g., updated) with a periodicity associated with a power control period. The power control period may, for example, be a duration of a slot or symbol for communication. The supply voltage for the error amplifier may be dynamically set to a minimum supply voltage (or at least a reduced supply voltage) that still allows generation of a peak voltage at a power amplifier output during the power control period. The dynamic control of the supply voltage to the error amplifier in this manner increases the efficiency of the error amplifier, and in turn, the efficiency of the amplification system.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include an envelope-tracking power supply implemented with a dynamic power supply voltage setting.

Figure 2:
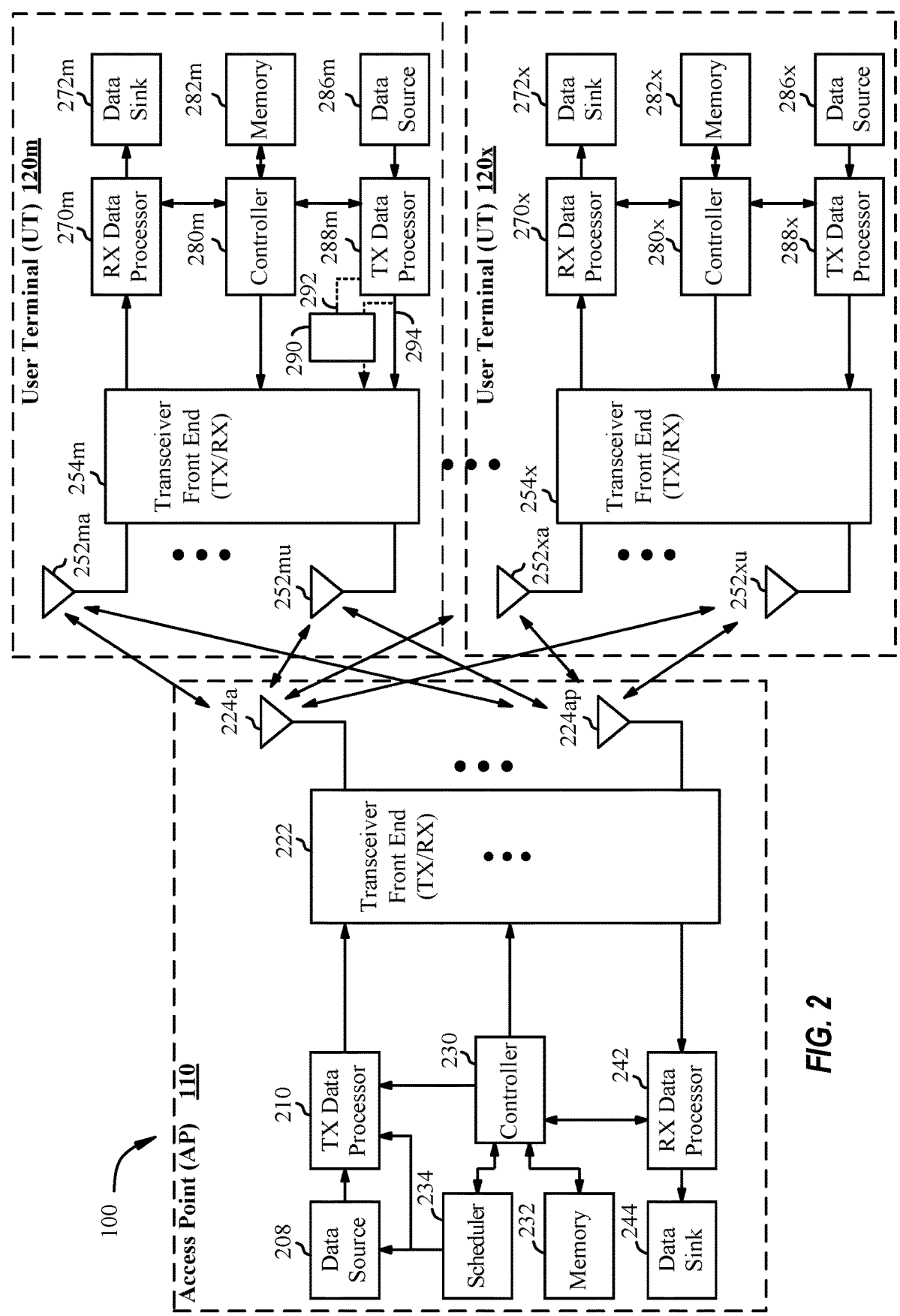
FIG. 2 is a block diagram illustrating an access point and two user terminals of a wireless system, in which aspects of the present disclosure may be practiced.

FIG. 2 shows a block diagram of access point 110 and two user terminals 120m and 120x in wireless communications system 100. Access point 110 is equipped with $N_{ap}$ antennas 224a through 224ap. User terminal 120m is equipped with $N_{ut,\ m}$ antennas 252ma through 252mu, and user terminal 120x is equipped with $N_{ut,\ x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,\ m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,\,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include an envelope-tracking power supply implemented with a dynamic power supply voltage setting.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,\,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
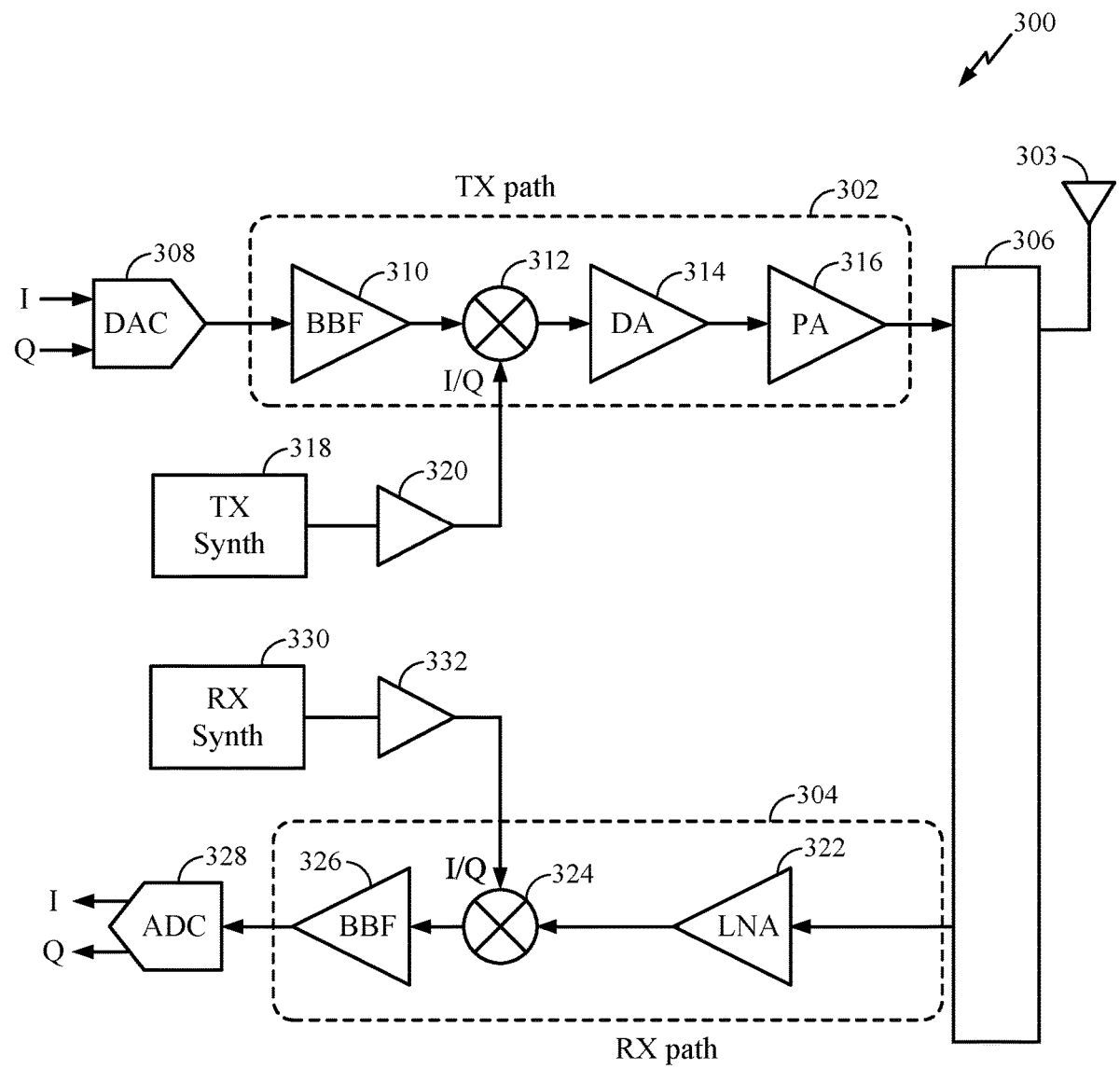
FIG. 3 is a block diagram of an example transceiver front end, in which aspects of the present disclosure may be practiced.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303. In some aspects, the PA 316 may be implemented using envelope tracking (e.g., of the digital input waveform to the DAC 308) with a dynamic power supply voltage setting.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Envelope-Tracking Power Supply

The amount of energy consumed by a power amplifier (PA) can have a large impact on battery life of mobile devices. Reducing current consumption of components such as a PA can increase battery life, which is an important design goal for mobile devices. Envelope tracking is a technique used to increase PA efficiency by using a combination of a low-efficiency-high-speed error amplifier (EA) with a high-efficiency-low-speed voltage regulator to set a supply voltage for the PA that tracks an envelope of an input signal to be amplified. However, the error amplifier is typically implemented as a linear regulator, which can be inefficient in its power consumption.

Certain aspects of the present disclosure are directed to techniques for reducing the power consumption of the error amplifier, and in turn, the amplification system including the PA. For example, certain aspects leverage knowledge of a waveform peak level over a defined period of time (e.g., slot or symbol) to dynamically minimize (or at least reduce) the peak supply voltage available to the error amplifier used to perform envelope tracking for a PA, such as the PA 316 described with respect to FIG. 3. As used herein, dynamically setting a supply voltage generally refers to updating a voltage setting for the supply voltage with a periodicity of a configured power control period, which may be a slot or symbol period, for example.

Figure 4:
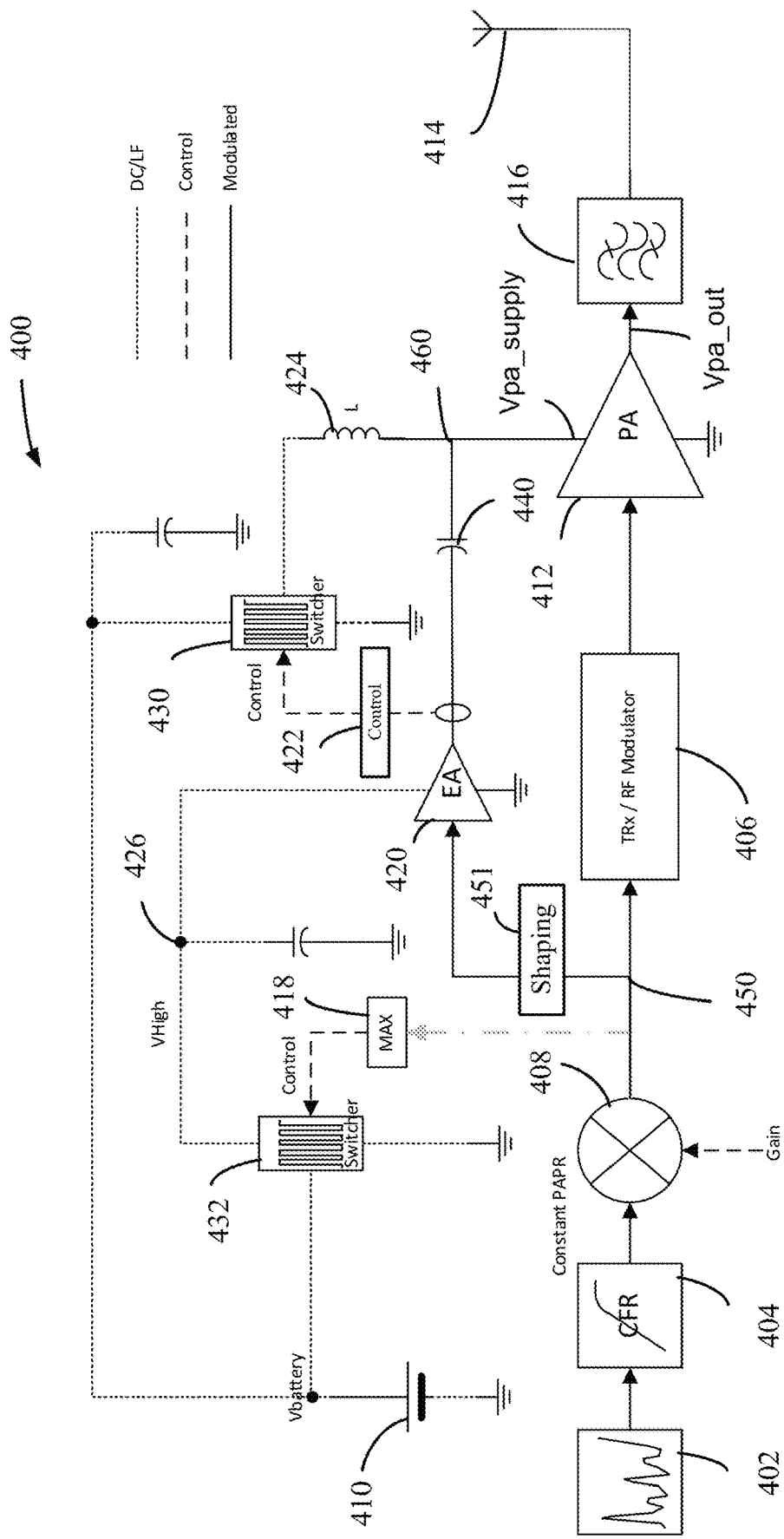
FIG. 4 is a block diagram illustrating an example amplification system, in accordance with certain aspects of the present disclosure.

FIG. 4 is a block diagram illustrating an example transmit chain having an amplification system 400, in accordance with certain aspects of the present disclosure. As shown, the amplification system 400 may receive an input signal 402 (e.g., an input waveform generated via a modulated waveform generator). FIG. 4 illustrates connections (e.g., traces) of the amplification system 400 that may be configured to carry direct current (DC) and/or low-frequency (LF) current, control signaling, or modulated waveforms, as shown by the signal-type legend.

In some cases, the input signal 402 may have a high peak-to-average-power ratio (PAPR). High PAPR waveforms are typically amplified using a PA which has a sufficient peak power capability (e.g., above mean power) to accurately represent the waveform across the PA's dynamic range. PAs typically have the highest efficiency at maximum (peak) power, whereas the efficiency of the PA generally drops off as the instantaneous power of the PA reduces. As an example, waveforms for second-generation (2G) radio access technologies, such as a Gaussian minimum-shift keying (GMSK) waveform, have a constant-envelope modulation. With a constant-envelope modulation, the PA can be put into a compression mode of operation that facilitates high-efficiency operation for the PA and reduces power consumption and drain from a battery, which is especially important in handheld mobile devices. However, the throughput rate of a 2G waveform is low due to the associated modulation scheme using phase information alone. Other radio access technologies, such as third-generation (3G), fourth-generation (4G), and fifth-generation (5G) technologies, use waveform amplitude to convey information, and as a result, have a higher PAPR (e.g., about 3 to 10 dB).

With fixed-drain PA solutions (e.g., PAs implemented with a fixed power supply voltage at a drain of a transistor of the PA), the power supply voltage may be held at a constant level set to service the peak power associated with an input waveform. As a result, the PA may operate inefficiently due to the PA being configured to service peak power specifications, when the PA does not constantly run at peak power. Solutions such as envelope tracking (ET) address this issue by dynamically reducing the voltage supply to the PA. For example, as shown in FIG. 4, the supply voltage (Vpa_supply) of the PA 412 (e.g., corresponding to PA 316) may be supplied using an error amplifier 420 (e.g., through an alternating current (AC)-coupling capacitor 440). The error amplifier 420 may be implemented as a linear regulator to generate Vpa_supply based on an envelope of the signal at node 450. In other words, the error amplifier 420 adjusts Vpa_supply such that the PA 412 can operate in compression, increasing the PA efficiency. In some implementations, the amplification system 400 includes a shaping circuit 451 for performing shaping of the envelope signal to be input to error amplifier 420. As shown, a modulator 406 may be coupled between node 450 and the input of the PA 412. The modulator 406 may include a digital to analog converter (DAC) configured to generate the signal to be amplified via the PA 412 based on the signal (e.g., digital signal) at node 450. The PA may be used to transmit signals using antenna 414 through filter 416.

In some implementations, a switched-mode power supply 432 (e.g., a boost converter) may be used to generate a supply voltage (VHigh) at supply node 426 of the error amplifier 420. For example, the switched-mode power supply 432 may receive a battery voltage (Vbattery) generated using battery 410 and generate VHigh by performing a voltage conversion (e.g., voltage boost) based on Vbattery. Another switched-mode power supply 430 may receive input power from the battery 410 and may have an output coupled to the supply node 460 through an inductive element 424, effectively acting as a current source supplying power to the PA 412. The switched-mode power supply 430 may reduce the supply burden of the error amplifier 420 (e.g., a linear regulator). Since the error amplifier 420 is a linear regulator and is less efficient than the switched-mode power supply 430, the switched-mode power supply 430 effectively increases the efficiency of the amplification system 400 by reducing the supply burden of the error amplifier 420. In some aspects, a control component 422 may be used to sense the current supplied by the error amplifier 420 and control the switched-mode power supply 430 based on the sensed voltage.

The error amplifier 420, along with switched-mode power supplies 430, 432, efficiently and dynamically convert Vbattery into a supply voltage at supply node 460 which tracks the envelope of the waveform at node 450, thereby improving PA efficiency. Envelope-tracking architectures use (although not exclusively) a combination of high-efficiency and low-frequency voltage-tracking circuitry, such as switched-mode power supplies 430, 432 having relatively high efficiency, and the error amplifier 420 (e.g., linear regulator) providing a relatively lower efficiency, but providing a higher frequency voltage-tracking capability.

The switched-mode power supply 432 generates VHigh to facilitate operation of error amplifier 420 such that error amplifier 420 generates the maximum voltage (e.g., waveform peak) expected at supply node 460, as determined over a defined time period. Typically, 3G/4G systems update the output power target over periods defined as slots or subframes (e.g., 100 s of microseconds), whereas 5G systems can update power on a symbol basis which can be as short as 16.67 μs. Although an input waveform to the amplification system 400 may be modulated at a faster rate (e.g., 10 ns period for a 100 MHz NR waveform), the symbol period is the minimum period over which the mean power is held constant and therefore the minimum period over which the peak of the PA voltage at supply node 460 may be determined. Certain aspects are directed to techniques for determining the minimum of the peak of Vpa_supply over a power control period (e.g., slot or symbol period) and controlling VHigh accordingly, in effect improving the efficiency of the error amplifier 420.

In some aspects, knowledge of a waveform peak level (e.g., the peak of Vpa_supply) known over a power control period (e.g., slot or symbol period) may be used to dynamically minimize (or at least reduce) VHigh, thereby applying an additional level of efficiency improvement to the envelope-tracking system. To do so, an input waveform (e.g., the waveform at node 450) of the amplification system 400 may be configured to have a constant PAPR, allowing determination of the waveform peak level that facilitates the dynamic minimization (or reduction) of VHigh.

In some aspects, a crest-factor-reduction (CFR) circuit 404 may be used to implement a constant PAPR at node 450. The CFR circuit 404 may be configured to achieve constant PAPR with respect to a target output power of the amplification system 400. The CFR circuit 404 may be implemented prior to any power control circuitry, such as a gain control circuit 408, such that the PAPR is decoupled (e.g., independent) from the target power that may be set by the gain control circuit 408. Once the PAPR is constant, the maximum PA supply voltage (Vpa_supply) over the defined power control period may be determined (e.g., calculated, measured, or estimated).

The determination of the maximum of Vpa_supply may be performed using various techniques described in more detail herein. For example, the maximum of Vpa_supply may be determined based on a radio frequency (RF) power back-off or power boost specification. The power back-off or boost specification may be set in response to a received power control command or may be due to a configured waveform type having a specific maximum power reduction (MPR). MPR is an allowance for power back-off when a more arduous waveform is in use (e.g., when using a higher order constellation), when using waveforms with higher spectral occupancy, or when operating within a band that has challenging spectral emission specifications. Waveform configuration may be highly dynamic in 4G and 5G systems, and therefore, MPR may change on a slot or symbol basis.

In some aspects, in addition to performing power control determination, an additional determination of what the peak (e.g., maximum) output PA voltage (e.g., Vpa_out) will be over the next (or current) slot/symbol period may be performed. The determined peak of Vpa_out may be used to determine a voltage setting for VHigh to reduce (e.g., minimize) VHigh for each slot/symbol period. Based on the determined voltage setting for VHigh, a control circuit 418 may control the switched-mode power supply 432 to generate VHigh accordingly.

As described, reducing VHigh allows for a more efficient operation of error amplifier 420, increasing the power efficiency of the amplification system 400, while also decreasing (e.g., minimizing) the voltage headroom of the PA 412. In other words, envelope-tracking power supplies typically employ a fast-acting, but inefficient linear regulator (e.g., error amplifier 420) which may be used to clean up any switching errors and which tracks the input waveform envelope accurately. This linear regulator may have its own supply rail (e.g., VHigh), which may come from a slower switched-mode power supply 432, as described above. Dynamically reducing VHigh supplied to the linear regulator (e.g., error amplifier 420) dynamically increases the efficiency of the linear regulator, and in turn, the efficiency of the amplification system 400.

Determining the set point for VHigh may involve performing a calculation to take advantage of the amplification system 400 having a linear relationship between PA_out and Vpa_supply (also referred to as the ET tracking system output voltage) in a compressed region of operation. In other words, while operating in compression, Vpa_supply controls the PA output voltage. Therefore, knowledge regarding PA_out may be used to determine the associated PA_supply, and in turn, the minimum VHigh that still allows for the generation of the determined PA_out.

An RF input voltage (e.g., voltage at node 450) to the PA 412 should have sufficient magnitude to allow the PA to operate in the compression region of operation. The compressed region of an ET system occurs at the highest input power range, and is therefore applicable to conditions where the input signal is at a peak voltage. As there is a linear relationship between the Vpa_out and Vpa_supply (e.g., while under compression), a linear interpolation calculation may be used to dynamically calculate Vpa_supply and VHigh.

In some aspects, the determination of a set point for VHigh may be based upon a modulated waveform at an input of the amplification system (e.g., waveform at node 450), or in some aspects, a calculation based upon calibration information. For example, VHigh may be set based on an instantaneous measurement of modulated data using a measurement block such as the control circuit 418. That is, the control circuit 418 may be implemented as a maximum hold circuit (e.g., a rectifier) which controls the switched-mode power supply 432 based on a maximum of the waveform at node 450.

Figure 5:
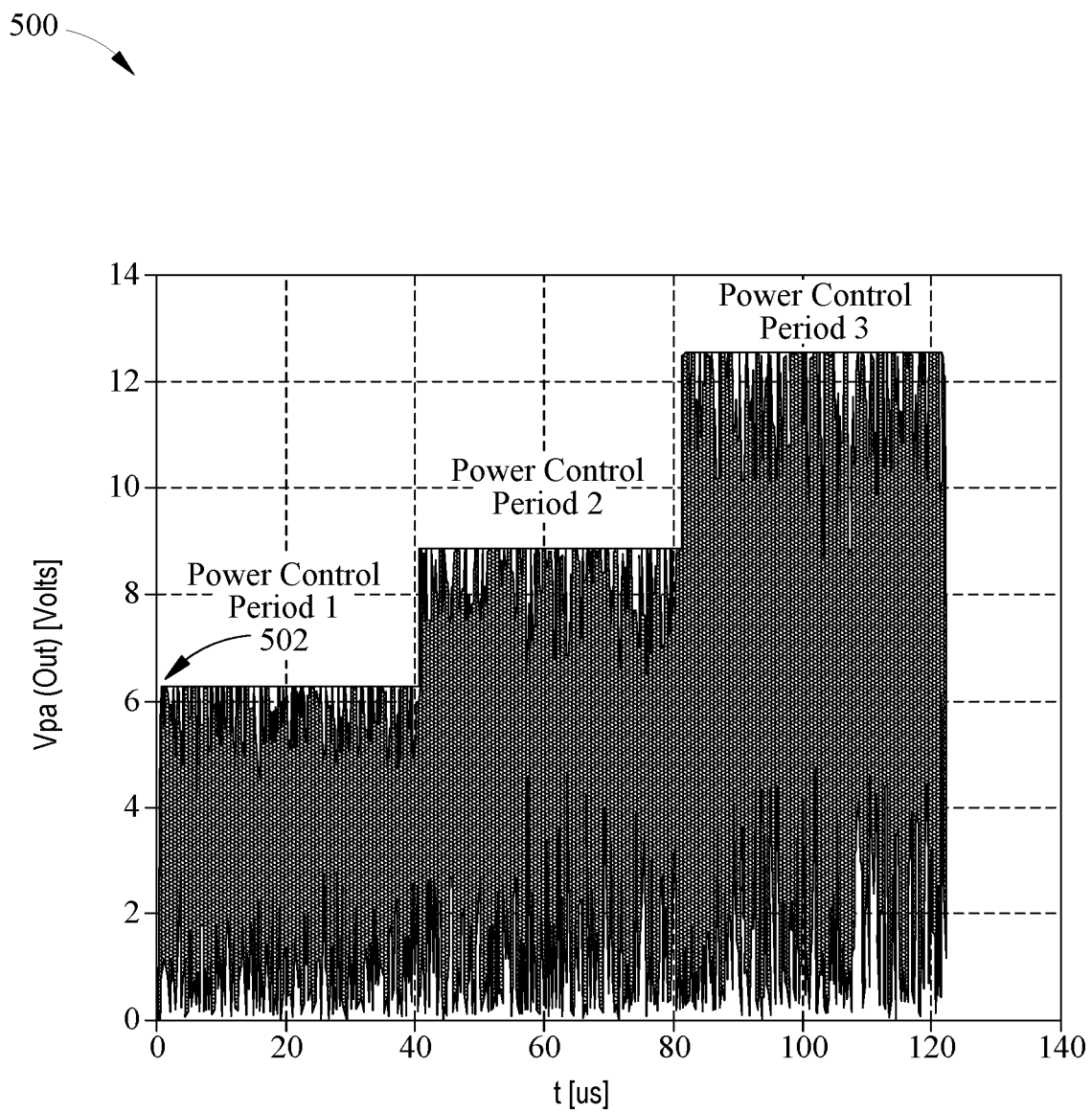
FIG. 5 is a graph showing an amplifier output voltage as a function of time across multiple power control periods, in accordance with certain aspects of the present disclosure.

FIG. 5 is a graph 500 showing Vpa_out for PA 412 as a function of time across multiple power control periods, in accordance with certain aspects of the present disclosure. As shown, during each power control period (e.g., corresponding to a symbol or slot period), a different power control setting may be used. For example, Vpa_out may be set to 6.3 volts during power control period 1, 8.9 volts during power control period 2, and 12.5 volts during power control period 3. The control circuit 418 may determine the maximum (e.g., peak) of the waveform at the beginning of each of the power control periods (e.g., at time 502), and set VHigh to the minimum value to facilitate generation of Vpa_out (e.g., 6.3 volts) during the power control period. Upon determining the maximum of the waveform at the beginning of the power control period, the determined maximum may be held until a subsequent power control period. The switched-mode power supply 432 may be configured to quickly set VHigh to a determined voltage setting for the associated power control period. Any delay in setting VHigh to the correct voltage may result in degradation at the PA output, but such degradation may be negligible, especially for slot-based power control or low-subcarrier spacing (SCS) symbol-based power control implementations, since the time period during which Vpa_out is degraded would be a small percentage of the total symbol or slot period.

In some aspects, the setting for VHigh may be determined based on knowledge of upcoming data in the digital domain. For example, referring back to FIG. 2, the digital data 294 from the TX data processor 288m (e.g., a baseband processor) may be processed by digital processing circuitry 290 to determine the set point of VHigh. For example, the digital processing circuitry 290 may determine the associated peak of Vpa_out based on the digital data and indicate the associated peak of Vpa_out to the control circuit 418 to set the corresponding voltage setting for VHigh.

In some aspects, the voltage setting for VHigh may be determined based on knowledge of the peak of Vpa_out over a subsequent power control period based on calibration data or knowledge of the PA's gain characteristics. For example, referring to FIG. 2, the TX data processor 288m may indicate a power control command 292 to the digital processing circuitry 290. The power control command may indicate the Vpa_out to be configured for the subsequent power control period. The digital processing circuitry 290 may use the characteristics of the PA to determine the corresponding Vpa_supply and set point for VHigh, as shown in FIG. 6.

Figure 6:
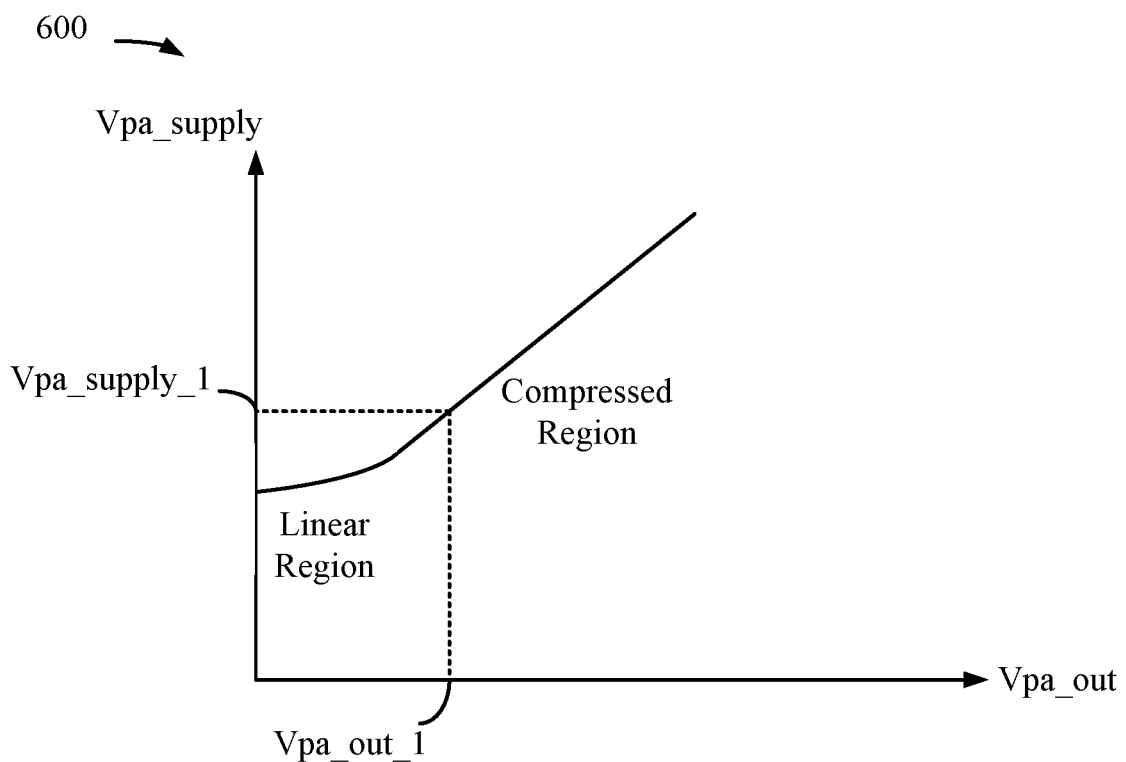
FIG. 6 illustrates characteristics of an amplifier to be used for determining an amplifier supply voltage, in accordance with certain aspects of the present disclosure.

FIG. 6 is a graph 600 illustrating characteristics of the PA 412 to be used for determining Vpa_supply, in accordance with certain aspects of the present disclosure. As shown, during a compression mode of operation, Vpa_supply may be determined based on Vpa_out due to the linear relation between Vpa_out and Vpa_supply. For instance, if the power control command indicates that Vpa_out_1 is to be configured for the subsequent power control period, the digital processing circuitry 290 may determine a corresponding Vpa_supply_1, based on which the control circuit 418 controls the switched-mode power supply 432 to provide the minimum (or at least reduced) VHigh to facilitate generation of Vpa_supply_1.

Figure 7:
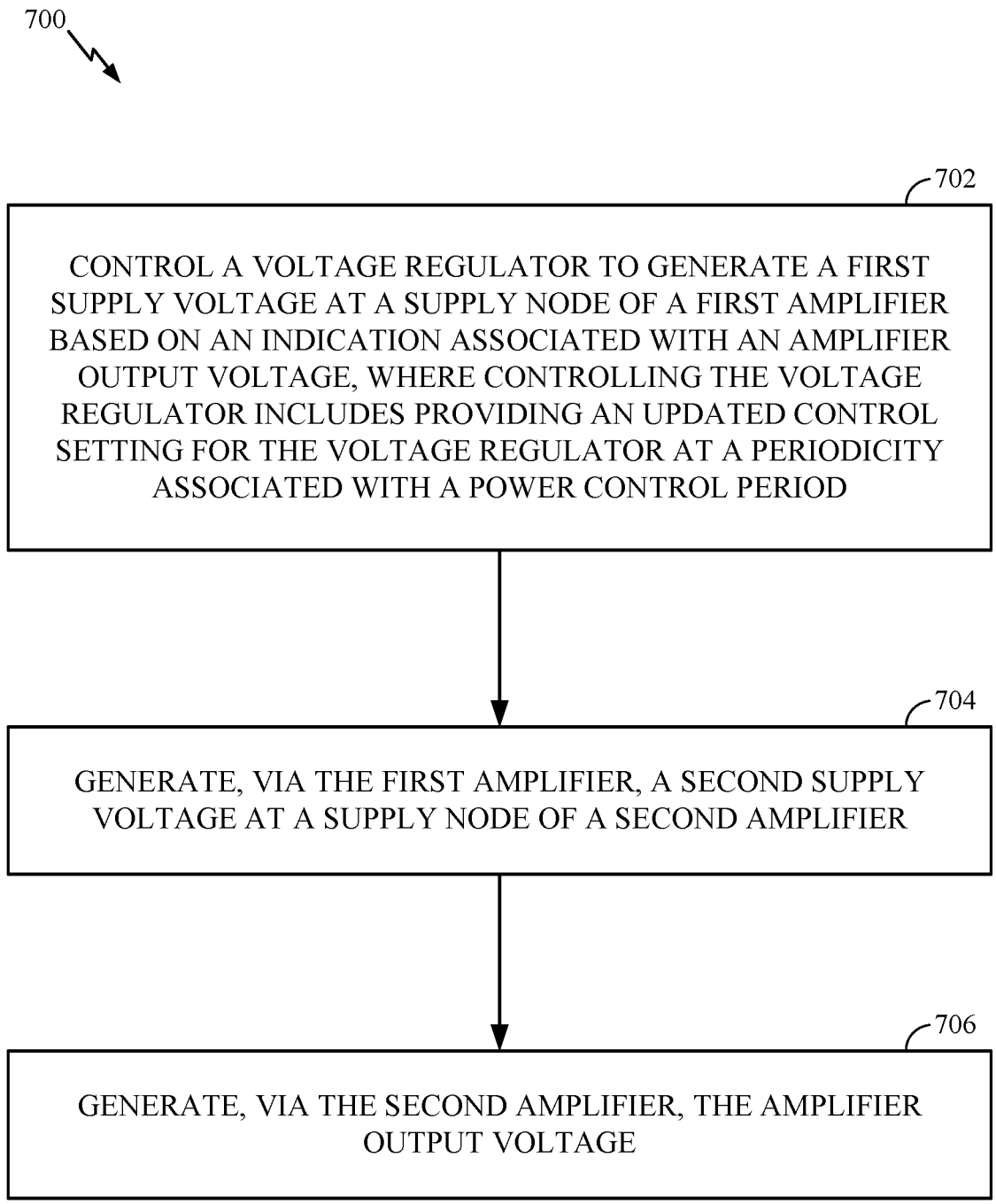
FIG. 7 is a flow diagram illustrating example operations for signal amplification, in accordance with certain aspects of the present disclosure.

FIG. 7 is a flow diagram illustrating example operations 700 for signal amplification, in accordance with certain aspects of the present disclosure. The operations 700 may be performed, for example, by an amplification system, such as the amplification system 400 of FIG. 4.

The operations 700 may begin, at block 702, with the amplification system controlling (e.g., via control circuit 418 and/or digital processing circuitry 290) a voltage regulator (e.g., switched-mode power supply 432) to generate a first supply voltage (e.g., VHigh) at a supply node (e.g., supply node 426) for a first amplifier (e.g., error amplifier 420) based on an indication associated with an amplifier output voltage (e.g., PA_out), where controlling the voltage regulator includes providing an updated control setting for the voltage regulator with a periodicity associated with a power control period (e.g., symbol or slot period). At block 704, the amplification system generates, via the first amplifier (e.g., error amplifier 420), a second supply voltage (e.g., Vpa_supply) at a supply node (e.g., supply node 460) for a second amplifier (e.g., PA 412). At block 706, the amplification system generates (e.g., via the PA 412) the amplifier output voltage.

In some aspects, the power control period may be a period during which a peak of the amplifier output voltage remains constant. For example, the power control period may include a duration of a slot or a symbol configured for communication by a wireless node. In some aspects, the amplification system generates (e.g., via the error amplifier 420) a signal at the supply node for the first amplifier based on an envelope of an input signal at an input node for the first amplifier. In some aspects, the voltage regulator is controlled such that the first supply voltage is at a minimum voltage required to generate the amplifier output voltage.

In some aspects, controlling the voltage regulator may include detecting a peak of an input signal (e.g., signal at node 450), and controlling the voltage regulator based on the detected peak. In some aspects, controlling the voltage regulator may include receiving the indication (e.g., power control command 292) associated with the amplifier output voltage, and determining the updated control setting based on the indication associated with the amplifier output voltage. The indication associated with the amplifier output voltage may be received during a current power control period (e.g., power control period 1 of FIG. 5), and the indication associated with the amplifier output voltage indicates an amplifier output voltage to be generated during a subsequent power control period (e.g., power control period 2 of FIG. 5). In some aspects, controlling the voltage regulator may include determining the updated control setting using a characteristic of the second amplifier, the characteristic indicating a relationship between the amplifier output voltage and a supply voltage at the supply node for the second amplifier. In some aspects, controlling the voltage regulator may include determining the updated control setting based on digital data (e.g., digital data 294 generated by TX data processor 288m) associated with an input waveform of the second amplifier.

Figure 8:
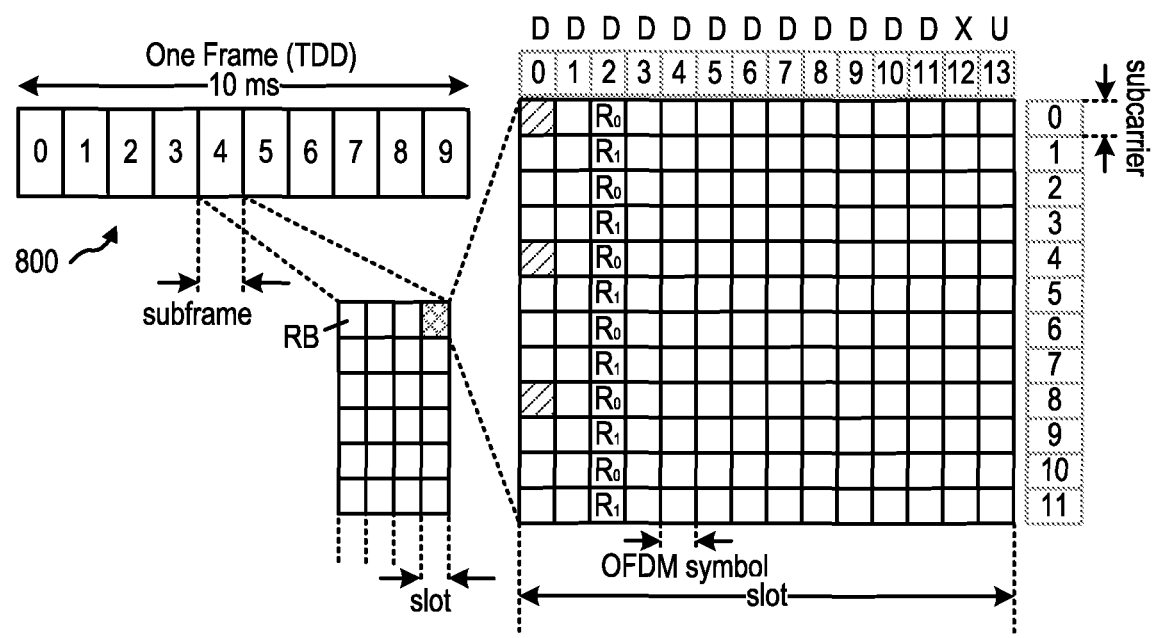
FIG. 8 depicts aspects of data structures for a wireless communication network.

FIG. 8 illustrates a frame 800 (e.g., having a duration of 10 ms) which may be divided into 10 equally sized subframes (e.g., each having a duration of 1 ms). Each subframe may include one or more time slots. A power control period described herein may include a duration of a slot (e.g., or mini-slot) or a symbol. Subframes may also include mini-slots, which may include 7, 4, or 2 symbols. In some examples, each slot may include 7 or 14 symbols, depending on the slot configuration. The number of slots within a subframe may be based on a slot configuration and numerology. A resource block (RB) may span 14 symbols (e.g., 1 slot) and 12 subcarriers. The subcarrier spacing and symbol length/duration are a function of the numerology associated with the frame, as shown.

Example Clauses

Implementation examples are described in the following numbered clauses:

Clause 1. An amplification system comprising: a first amplifier configured to generate an amplifier output voltage; a second amplifier having an output coupled to a supply node for the first amplifier; a voltage regulator having an output coupled to a supply node for the second amplifier; and control circuitry configured to control the voltage regulator to generate a supply voltage at the supply node for the second amplifier based on an indication associated with the amplifier output voltage, the control circuitry being configured to control the voltage regulator through at least providing an updated control setting for the voltage regulator with a periodicity associated with a power control period.

Clause 2. The amplification system of clause 1, wherein the power control period comprises a period during which a peak of the amplifier output voltage remains constant.

Clause 3. The amplification system of any one of clauses 1-2, wherein the power control period comprises a duration of a slot or a symbol configured for communication by a wireless node having the amplification system.

Clause 4. The amplification system of any one of clauses 1-3, wherein the first amplifier comprises a power amplifier.

Clause 5. The amplification system of any one of clauses 1-4, wherein the second amplifier composes a linear regulator.

Clause 6. The amplification system of any one of clauses 1-5, wherein the second amplifier is configured to generate a signal at the supply node for the first amplifier based on an envelope of an input signal at an input node coupled to an input of the first amplifier.

Clause 7. The amplification system of clause 6, wherein the input signal has a constant peak-to-average-power ratio (PAPR).

Clause 8. The amplification system of clause 7, further comprising a crest-factor-reduction (CFR) circuit coupled to the input node and configured to generate the input signal having the constant PAPR.

Clause 9. The amplification system of clause 8, further comprising a gain control circuit coupled between the input node and the CFR circuit.

Clause 10. The amplification system of any one of clauses 6-9, further comprising a modulator coupled between the input node and the first amplifier.

Clause 11. The amplification system of any one of clauses 1-10, wherein the voltage regulator comprises a switched-mode power supply.

Clause 12. The amplification system of any one of clauses 1-11, wherein the control circuitry is configured to control the voltage regulator such that the supply voltage is at a minimum voltage to generate the amplifier output voltage.

Clause 13. The amplification system of any one of clauses 1-12, wherein, in being configured to control the voltage regulator, the control circuitry is configured to: detect a peak of an input signal of the amplification system; and control the voltage regulator based on the detected peak.

Clause 14. The amplification system of any one of clauses 1-13, wherein, in being configured to control the voltage regulator, the control circuitry is configured to: receive the indication associated with the amplifier output voltage; and determine the updated control setting based on the indication associated with the amplifier output voltage.

Clause 15. The amplification system of clause 14, wherein the indication of the amplifier output voltage comprises a power control command.

Clause 16. The amplification system of clause 15, wherein the control circuitry is configured to receive the power control command during a current power control period, and wherein the power control command indicates the amplifier output voltage to be generated during a subsequent power control period.

Clause 17. The amplification system of any one of clauses 14-16, wherein the control circuitry is configured to determine the updated control setting using a relationship between the amplifier output voltage and a supply voltage at the supply node for the first amplifier.

Clause 18. The amplification system of any one of clauses 1-17, wherein, in controlling the voltage regulator, the control circuitry is configured to determine the updated control setting based on digital data associated with an input waveform of the amplification system.

Clause 19. The amplification system of clause 18, further comprising a digital-to-analog converter configured to generate a signal to be amplified via the first amplifier based on the digital data.

Clause 20. A method for signal amplification, comprising: controlling a voltage regulator to generate a first supply voltage at a supply node for a first amplifier based on an indication associated with an amplifier output voltage, wherein controlling the voltage regulator includes providing an updated control setting for the voltage regulator with a periodicity associated with a power control period; generating, via the first amplifier, a second supply voltage at a supply node for a second amplifier; and generating, via the second amplifier, the amplifier output voltage.

Clause 21. The method of clause 20, wherein the power control period comprises a period during which a peak of the amplifier output voltage remains constant.

Clause 22. The method of any one of clauses 20-21, wherein the power control period comprises a duration of a slot or a symbol configured for communication by a wireless node.

Clause 23. The method of any one of clauses 20-22, further comprising generating, via the first amplifier, a signal at the supply node for the second amplifier based on an envelope of an input signal at an input node coupled to an input of the second amplifier.

Clause 24. The method of any one of clauses 20-23, wherein the voltage regulator is controlled such that the first supply voltage is at a minimum voltage to generate the amplifier output voltage.

Clause 25. The method of any one of clauses 20-24, wherein controlling the voltage regulator comprises: detecting a peak of an input signal at an input node coupled to the second amplifier; and controlling the voltage regulator based on the detected peak.

Clause 26. The method of any one of clauses 20-25, wherein controlling the voltage regulator comprises: receiving the indication associated with the amplifier output voltage; and determining the updated control setting based on the indication associated with the amplifier output voltage.

Clause 27. The method of clause 26, wherein the indication associated with the amplifier output voltage is received during a current power control period, and wherein the indication associated with the amplifier output voltage indicates an amplifier output voltage to be generated during a subsequent power control period.

Clause 28. The method of any one of clauses 26-27, wherein controlling the voltage regulator comprises determining the updated control setting using a relationship between the amplifier output voltage and a supply voltage at the supply node for the second amplifier.

Clause 29. The method of any one of clauses 20-28, wherein controlling the voltage regulator comprises determining the updated control setting based on digital data associated with an input waveform of the second amplifier.

Clause 30. An apparatus for signal amplification, comprising: means for controlling a voltage regulator to generate a first supply voltage based on an indication associated with an amplifier output voltage, the means for controlling comprising means for providing an updated control setting for the voltage regulator with a periodicity associated with a power control period; means for generating a second supply voltage using the first supply voltage; and means for generating the amplifier output voltage using the second supply voltage.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits.

One or more of the components, steps, features, and/or functions illustrated herein may be rearranged and/or combined into a single component, step, feature, or function or embodied in several components, steps, or functions. Additional elements, components, steps, and/or functions may also be added without departing from novel features disclosed herein. The apparatus, devices, and/or components illustrated herein may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." For example, means for controlling may include a control circuit such as control circuit 418 of digital processing circuitry (e.g., the digital processing circuitry 290). Means for generating may include an amplifier, such as the power amplifier 412 or error amplifier 420.

These apparatus and methods are described in the detailed description and illustrated in the accompanying drawings by various blocks, modules, components, circuits, steps, processes, algorithms, etc. (collectively referred to as "elements"). These elements may be implemented using hardware, software, or combinations thereof. Whether such elements are implemented as hardware or software depends upon the particular application and design constraints imposed on the overall system.

What is claimed is:

1. An amplification system comprising:
   a crest-factor-reduction (CFR) circuit coupled to an input node and configured to generate an input signal having a constant peak-to-average-power ratio (PAPR) for a power control period;
   a first amplifier configured to generate an amplifier output voltage based on the input signal;
   a second amplifier having an output coupled to a supply node for the first amplifier;
   a voltage regulator having an output coupled to a supply node for the second amplifier; and
   control circuitry configured to control the voltage regulator to generate a supply voltage at the supply node for the second amplifier based on an indication associated with the amplifier output voltage, the control circuitry being configured to control the voltage regulator through at least providing an updated control setting for the voltage regulator with a periodicity associated with the power control period.

2. The amplification system of claim 1, wherein the power control period comprises a period during which a peak of the amplifier output voltage remains constant.

3. The amplification system of claim 1, wherein the power control period comprises a duration of a slot or a symbol configured for communication by a wireless node having the amplification system.

4. The amplification system of claim 1, wherein the first amplifier comprises a power amplifier.

5. The amplification system of claim 1, wherein the second amplifier composes a linear regulator.

6. The amplification system of claim 1, wherein the second amplifier is configured to generate a signal at the supply node for the first amplifier based on an envelope of the input signal at the input node coupled to an input of the first amplifier.

7. The amplification system of claim 1, further comprising a gain control circuit coupled between the input node and the CFR circuit.

8. The amplification system of claim 6, further comprising a modulator coupled between the input node and the first amplifier.

9. The amplification system of claim 1, wherein the voltage regulator comprises a switched-mode power supply.

10. The amplification system of claim 1, wherein the control circuitry is configured to control the voltage regulator such that the supply voltage is at a minimum voltage to generate the amplifier output voltage.

11. The amplification system of claim 1, wherein, in being configured to control the voltage regulator, the control circuitry is configured to:
   detect a peak of the input signal of the amplification system; and
   control the voltage regulator based on the detected peak.

12. The amplification system of claim 1, wherein, in being configured to control the voltage regulator, the control circuitry is configured to:
   receive the indication associated with the amplifier output voltage; and
   determine the updated control setting based on the indication associated with the amplifier output voltage.

13. The amplification system of claim 12, wherein the indication of the amplifier output voltage comprises a power control command.

14. The amplification system of claim 13, wherein the control circuitry is configured to receive the power control command during a current power control period, and wherein the power control command indicates the amplifier output voltage to be generated during a subsequent power control period.

15. The amplification system of claim 12, wherein the control circuitry is configured to determine the updated control setting using a relationship between the amplifier output voltage and a supply voltage at the supply node for the first amplifier.

16. The amplification system of claim 1, wherein, in controlling the voltage regulator, the control circuitry is configured to determine the updated control setting based on digital data associated with an input waveform of the amplification system.

17. The amplification system of claim 16, further comprising a digital-to-analog converter configured to generate a signal to be amplified via the first amplifier based on the digital data.

18. A method for signal amplification, comprising:
- generating, via a crest-factor-reduction (CFR) circuit, an input signal having a constant peak-to-average-power ratio (PAPR) for a power control period;
- controlling a voltage regulator to generate a first supply voltage at a supply node for a first amplifier based on an indication associated with an amplifier output voltage, wherein controlling the voltage regulator includes providing an updated control setting for the voltage regulator with a periodicity associated with the power control period;
- generating, via the first amplifier, a second supply voltage at a supply node for a second amplifier; and
- generating, via the second amplifier, the amplifier output voltage.

19. The method of claim 18, wherein the power control period comprises a period during which a peak of the amplifier output voltage remains constant.

20. The method of claim 18, wherein the power control period comprises a duration of a slot or a symbol configured for communication by a wireless node.

21. The method of claim 18, further comprising generating, via the first amplifier, a signal at the supply node for the second amplifier based on an envelope of the input signal at an input node coupled to an input of the second amplifier.

22. The method of claim 18, wherein the voltage regulator is controlled such that the first supply voltage is at a minimum voltage to generate the amplifier output voltage.

23. The method of claim 18, wherein controlling the voltage regulator comprises:
- detecting a peak of the input signal at an input node coupled to the second amplifier; and
- controlling the voltage regulator based on the detected peak.

24. The method of claim 18, wherein controlling the voltage regulator comprises:
- receiving the indication associated with the amplifier output voltage; and
- determining the updated control setting based on the indication associated with the amplifier output voltage.

25. The method of claim 24, wherein the indication associated with the amplifier output voltage is received during a current power control period, and wherein the indication associated with the amplifier output voltage indicates an amplifier output voltage to be generated during a subsequent power control period.

26. The method of claim 24, wherein controlling the voltage regulator comprises determining the updated control setting using a relationship between the amplifier output voltage and a supply voltage at the supply node for the second amplifier.

27. The method of claim 18, wherein controlling the voltage regulator comprises determining the updated control setting based on digital data associated with an input waveform of the second amplifier.

28. An apparatus for signal amplification, comprising:
- means for generating an input signal having a constant peak-to-average-power ratio (PAPR) for a power control period;
- means for controlling a voltage regulator to generate a first supply voltage based on an indication associated with an amplifier output voltage, the means for controlling comprising means for providing an updated control setting for the voltage regulator with a periodicity associated with the power control period;
- means for generating a second supply voltage using the first supply voltage; and
- means for generating the amplifier output voltage using the second supply voltage.

* * * * *